United States Patent [19]
McDaniel

[11] Patent Number: 6,023,441
[45] Date of Patent: *Feb. 8, 2000

[54] METHOD AND APPARATUS FOR SELECTIVELY ENABLING INDIVIDUAL SETS OF REGISTERS IN A ROW OF A REGISTER ARRAY

[75] Inventor: Bart McDaniel, Phoenix, Ariz.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/726,134

[22] Filed: Oct. 4, 1996

Related U.S. Application Data

[63] Continuation of application No. 08/521,170, Aug. 30, 1995, abandoned.

[51] Int. Cl.$^7$ .................................................. G11C 8/00
[52] U.S. Cl. ..................... 365/230.06; 365/220; 365/63
[58] Field of Search ................... 365/230.06, 230.03, 365/189.05, 63, 220

[56] References Cited

U.S. PATENT DOCUMENTS

| | | | |
|---|---|---|---|
| 4,542,486 | 9/1985 | Anami | 365/230.06 |
| 5,083,294 | 1/1992 | Okajima | 365/230.03 |
| 5,193,074 | 3/1993 | Anami | 365/230.03 |
| 5,369,619 | 11/1994 | Ohba | 365/230.06 |

*Primary Examiner*—A. Zarabian
*Attorney, Agent, or Firm*—Blakely, Sokoloff, Taylor & Zafman LLP

[57] ABSTRACT

A method and apparatus for selectively enabling individual sets of registers in a row of a register array. One embodiment of the present invention is a register array that has a number of registers arranged in a number of rows and columns. Each row of registers includes N sets of registers, where N is an integer greater than 1. The register array also includes a said selector and N said-selecting enable lines for each row of registers. Each enable line of the N set-selecting enable lines couple the set selector to one set of registers of the N sets of registers in each row. In other words, the set selector enables a particular set of registers (i.e., causes a particular set of registers to output their contents on their output bit lines) by providing an enable signal to the particular set of registers on the enable line that couples the set selector to the particular set of registers.

11 Claims, 6 Drawing Sheets

METHOD AND APPARATUS FOR SELECTIVELY ENABLING INDIVIDUAL SETS OF REGISTERS IN A ROW OF A REGISTER ARRAY

This is a continuation of application Ser. No. 08/521,170 filed Aug. 30, 1995 abandoned Oct. 4, 1996.

BACKGROUND OF THE INVENTION

1. Field of the Invention

The present invention relates to the field of computers, and particularly to a method and apparatus for selectively enabling individual sets of registers in a row of a register array.

2. Description of the Related Art

Historically, simple microprocessors have processed instructions one after another. For instance, in one instruction processing pipeline, simple microprocessors often sequentially (1) fetch an instruction, (2) fetch an operand for that instruction, (3) execute the instruction, and (4) writeback the result of the execution to a register. In addition, to further increase their instruction processing speed, a number of prior art single pipeline processors overlap their pipeline stages so that they can operate on several instructions simultaneously.

Furthermore, in recent years, an increasing number of processors have further increased their instruction processing speed by simultaneously processing several instructions in several parallel instruction processing pipelines. These processors are referred to as superscalar processors, in which N parallel instruction pipelines provide the ability to execute N instructions simultaneously (where N is an integer representing the number of parallel pipelines). In order for superscalar processors to operate efficiently, these processors have an instruction fetch unit which, during the instruction fetch stage, can provide its N instruction pipelines with N instruction words, by (1) supplying an instruction pointer identifying the starting address of the N instruction words to an instruction memory (such as an instruction cache), and (2) retrieving the N instructions words from the instruction memory.

Unfortunately, many prior art superscalar processors do not fully take advantage of their increased instruction processing speed (i.e., do not take advantage of their parallel processing capability) because they have slow instruction retrieval speeds as they use instruction memory arrays that have slow instruction outputting speeds. Prior art instruction memory arrays have slow instruction outputting speeds because they cannot simultaneously enable in one clock cycle all N sets of registers that store the requested N instruction words (i.e., cannot in one clock cycle cause all the registers in the N sets of registers to output their data on their differential output bit line pairs).

FIG. 1 presents one prior art instruction memory array used in prior art superscalar processors. As shown in this figure, prior art instruction memory array 100 is a MOS cache that has a one word width (i.e., it is a cache which stores one and only one instruction word per row). Memory array 100 has a slow instruction outputting speed, because only one word can be enabled per clock cycle by row decoder 105 (i.e., only one set of registers can be forced to output their contents in a clock cycle).

FIGS. 2A and 2B present another prior art instruction memory used in prior art superscalar processors. As shown in this figure, instruction memory array 200 is a MOS cache which has a width of four words (i.e., each row of cache 200 contains four words). This prior art instruction memory array has a faster instruction outputting speed than instruction memory 100 of FIG. 1, because (unlike memory 100 which only enables one word per clock cycle) row decoder 205 enables four words per clock cycle by providing an enable signal on one of the row enable lines X.

However, even this prior art memory array does not provide the fastest instruction accessing speed because row decoder 205 requires two clock cycles to enable a set of data words on two different rows. In other words, instruction memory array 200 does not have an optimal instruction outputting speed because it cannot enable non-overlapping data word sets on two different rows in one clock cycle. Consequently, prior art superscalar processors that utilize either cache 100 or cache 200 do not fully take advantage of their increased instruction processing speed because they have slow instruction retrieval speeds as they use instruction memory arrays that have slow instruction outputting speeds.

In the prior art implementation of FIG. 2A, maximum throughput for delivering a set of N instruction words occurs only when the instruction pointer (address) of the set is "aligned" to the physical address boundary; that is, all instructions of the set are located on the same row (e.g., all N commands are located on row X0).

In the case, that instruction pointer does not occur at perfect physical alignment (i.e., unaligned) the set N occurs along two physical rows (e.g., X0 and X1). In the instruction memory array of FIG. 2A, the selector block is only able to select one physical row in an access cycle, hence accessing "unaligned" data sets will take two access cycles, thereby reducing by one-half the access speed.

Therefore, there is a need for an optimal data dispatch method and apparatus for allowing an N-word wide memory array to simultaneously enable a non-overlapping set of registers that store N words on un-aligned addresses. In addition, there is a more specific need for a method and an apparatus for reducing a superscalar processor's instruction retrieval time (i.e., the time needed to obtain N requested instruction words from an instruction memory) and thereby taking advantage of the parallel pipeline processing capability of superscalar processors. In other words, to improve further the instruction processing efficiency of superscalar processors, there is a need for an N-wide register array (i.e., a register array that has N sets of registers in a row of registers) that can quickly enable N non-overlapping sets of registers when it receives an instruction pointer identifying the N instruction words, regardless of the address alignment (e.g., unaligned address). Consequently, a method and apparatus that in one clock cycle can issue the instruction word, pointed to by the instruction pointer and the N−1 instruction words that follow it, is desirable.

FIGS. 3A and 3B depict an embodiment of an SRAM cache memory that enables unaligned addressing of four-word data sets. This unaligned data fetching is enabled by employing four word lines along a physical row in the data array and selecting the appropriate word lines across two contiguous rows to select the unaligned four word set. This embodiment bears the overhead of requiring four separate physical word lines (WLO–WL3) to pass through each row in the array, as well as, circuitry in the select blocks for separately selecting the appropriate word lines among one or two contiguous rows.

Another method to enable the unaligned access function would be to use a single physical word line, but in conjunction with N times as many selector blocks (i.e., x-decoder blocks). In the memory array of FIG. 3A, four selector blocks are required. The penalty to be paid in this case would be the large area required to implement the multiple row selector blocks.

FIGS. 3A and 3B illustrate two prior art circuits for accessing data sets that fall along an unaligned address. A problem for the first circuit shown in FIG. 3A, is the need for four word lines running through the memory cell. Accordingly, in almost every conceivable implementation, this prior art approach increases the size of the memory cell, and correspondingly increases the cost to manufacture this cell. Another problem with this approach is the slightly lower memory access time due to a higher parasitic loadings stemming from the larger memory cell size.

The second circuit, illustrated in FIG. 3B, employs four independent selector blocks, in conjunction with a typical single word line memory cell. This approach also suffers from a massive area overhead involved by using multiple selector blocks. Accordingly, this increased layout area increases the cost of manufacture and decreases memory access performance.

SUMMARY OF THE INVENTION

The present invention provides a method and apparatus for selectively enabling individual sets of registers in a row of a register array. One embodiment of the present invention is a register array that has a number of registers arranged in a number of rows and columns. Each row of registers includes 4 sets of registers. The register array also includes a set selector and 4 set-selecting enable lines for each row of registers. Each enable line of the 4 set-selecting enable lines couple the set selector to one set of registers of the 4 sets of registers in each row. In other words, the set selector enables a particular set of registers (i.e., causes a particular set of registers to output their contents on their output bit lines) by providing an enable signal to the particular set of registers on the enable line that couples the set selector to the particular set of registers. This register set size can be expanded to 4N, where N is an integer greater than 1, by using multiple sub arrays in parallel.

BRIEF DESCRIPTION OF THE DRAWINGS

The objects, features, and advantages of the present invention will be apparent from the following detailed description, in which.

DETAILED DESCRIPTION OF THE INVENTION

In the following description, numerous details are set forth in order to provide a thorough understanding of the present invention. However, it will be understood by one of ordinary skill in the art that these specific details are not required in order to practice the invention. In other instances, well-known electrical structures and circuits are shown in block diagram form in order not to obscure the present invention with unnecessary detail.

Figure 1:
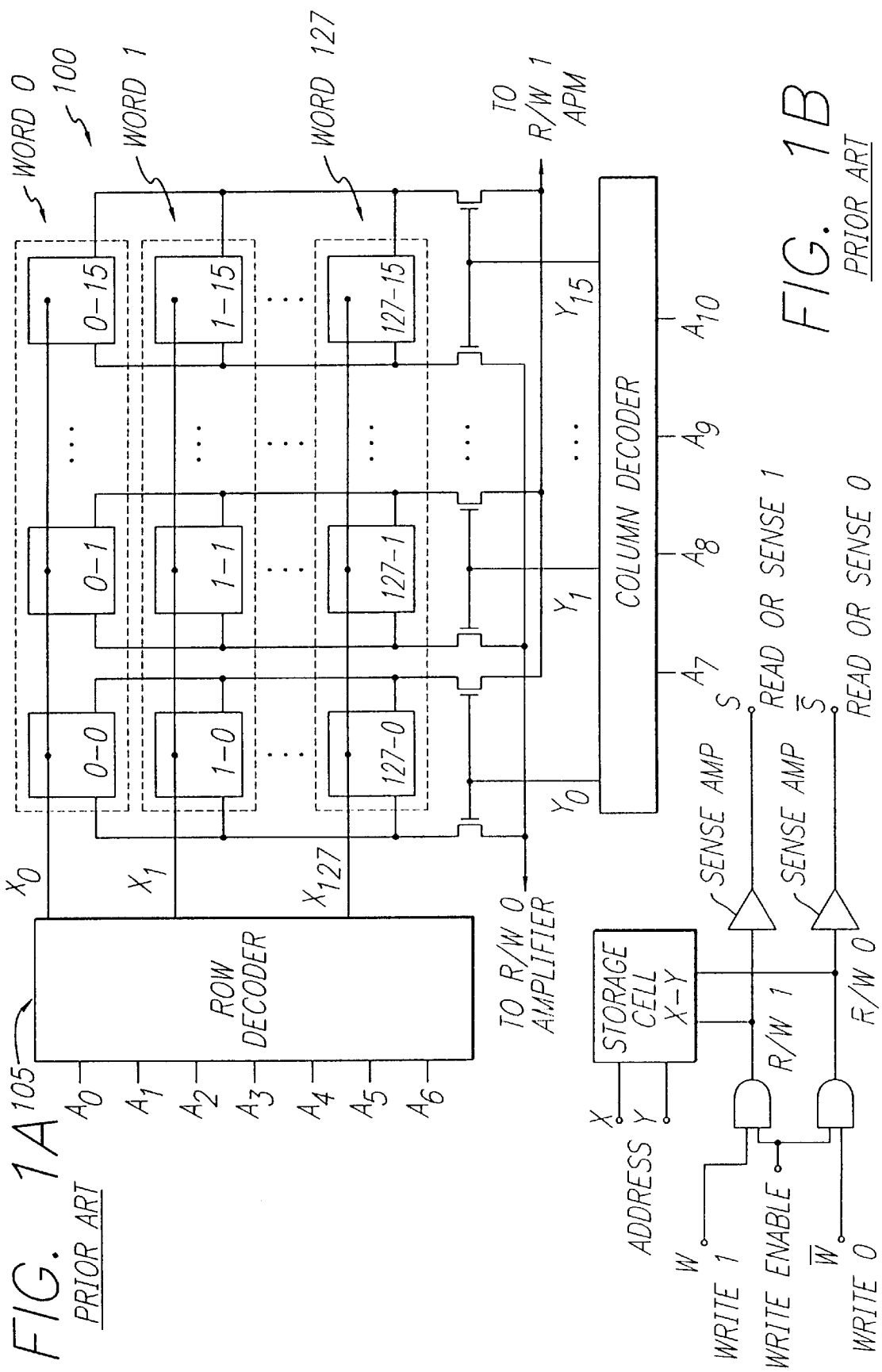
FIGS. 1A and 1B present one prior art instruction memory array.
Figure 2:
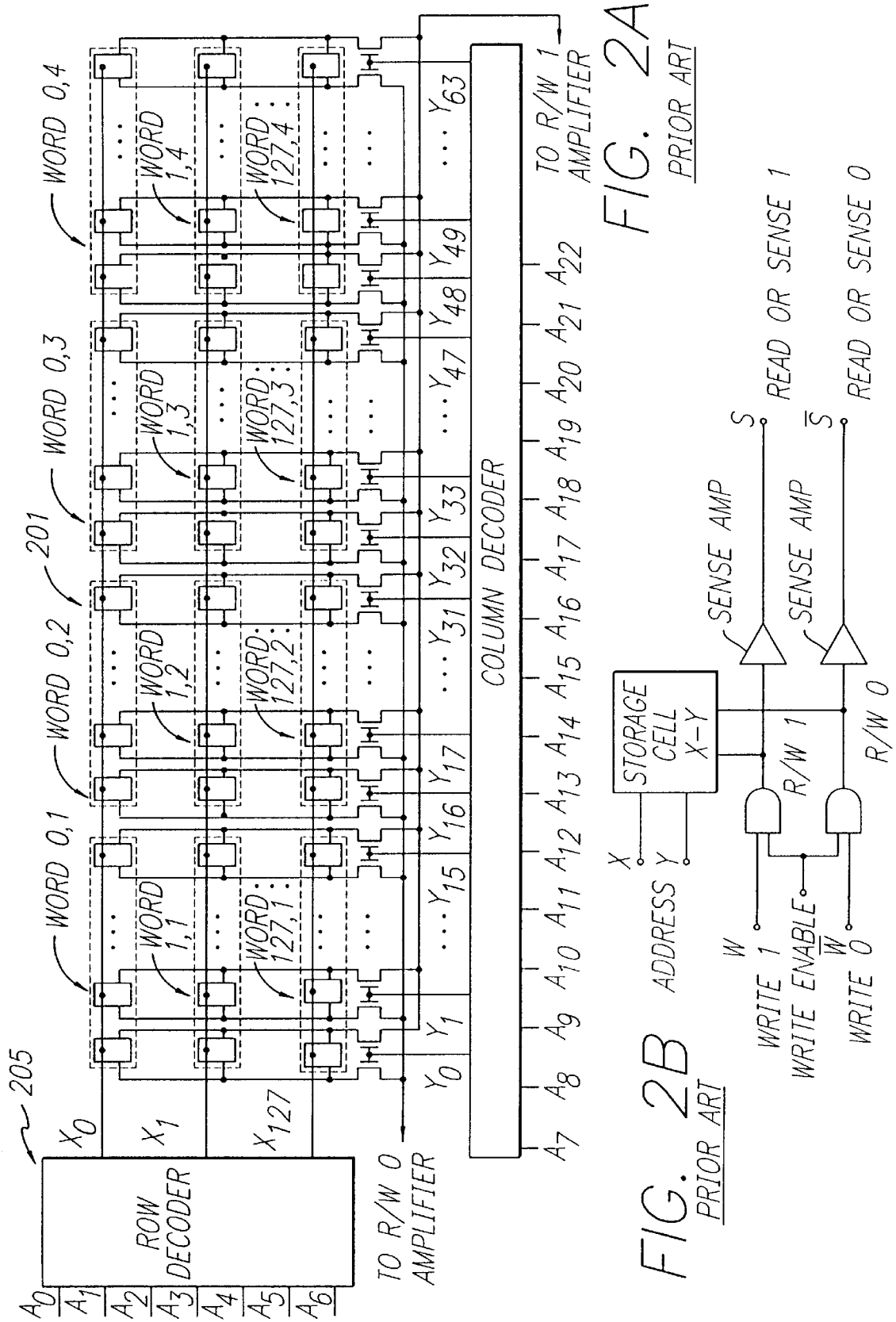
FIGS. 2A and 2B present another prior art instruction memory array.
Figure 3:
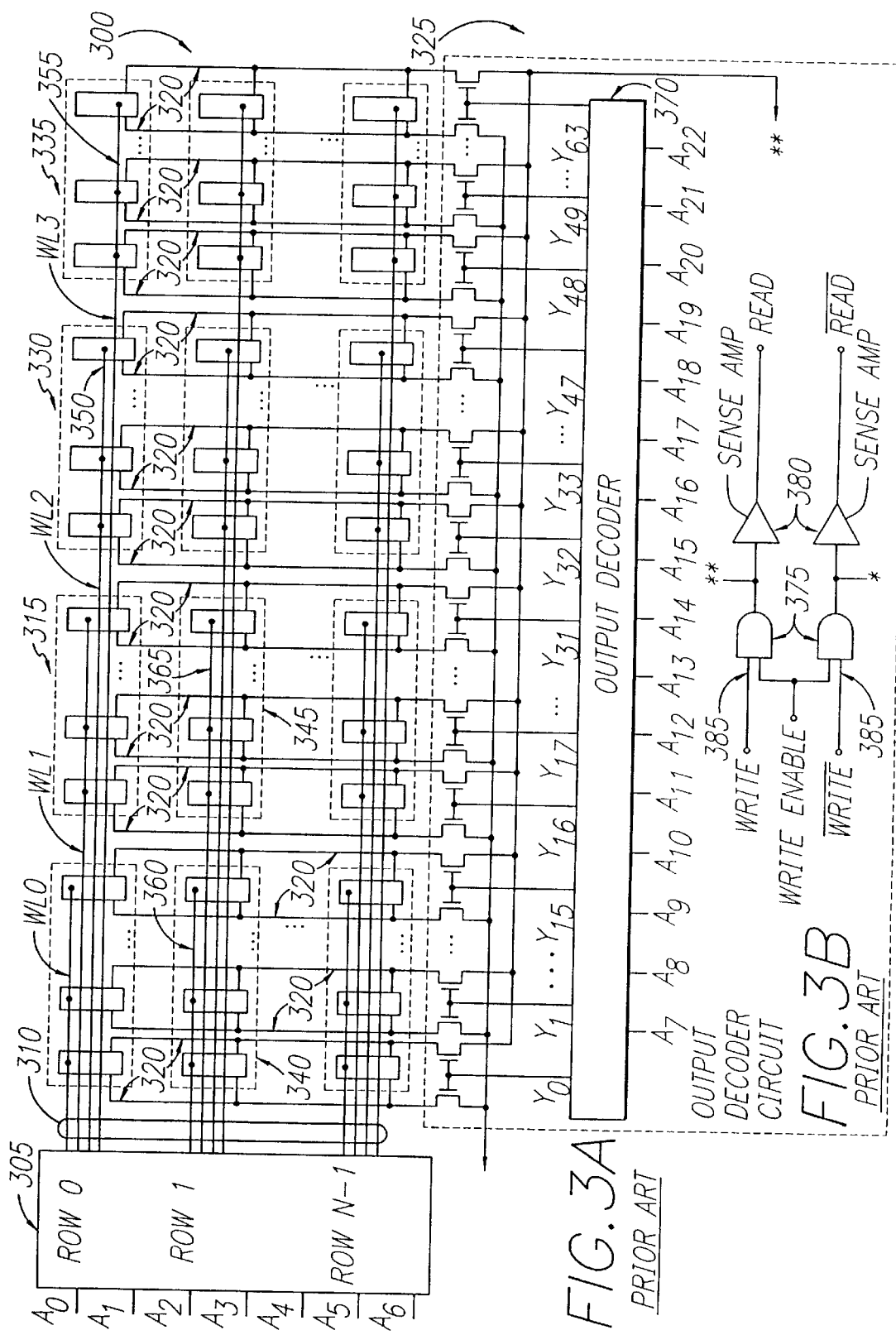
FIGS. 3A and 3B present one embodiment of the prior art memory apparatus for selectively enabling individual sets of registers in a row of a register array.

The present invention provides a method and apparatus for selectively enabling individual sets of registers in a row of a register array. One embodiment of the present invention is a register array that has a number of registers arranged in a number of rows and columns. Each row of registers includes N sets of registers, where N is an integer greater than 1. The register array also includes a set selector and N set-selecting enable lines for each row of registers. Each enable line of the N set-selecting enable lines couple the set selector to one set of registers of the N sets of registers in each row. In other words, the set selector enables a particular set of registers (i.e., causes a particular set of registers to output their contents on their output bit lines) by providing an enable signal to the particular set of registers on the enable line that couples the set selector to the particular set of registers. FIGS. 3A and 3B present an embodiment of a prior art memory apparatus for selectively enabling individual sets of registers in a row of a register array. As shown in this figure, memory 300 includes set selector 305, set selecting enable lines 310, register array 315, output bit lines 320, and output detection circuitry 325. As shown in this figure, set selector 305 receives an input signal (e.g., instruction pointer) that can identify up to four non-overlapping sets of registers (e.g., that can identify up to four non-overlapping instruction words).

Based on this input signal, set selector 305 then uses up to four enable lines 310 to supply up to four enable signals to up to four sets of registers in register array 315. For example, if the input signal identifies register sets 330, 335, 340, and 345, set selector 305 in one clock cycle enables the registers in these sets (i.e., causes the registers in these sets to output their contents on their output differential bit line pairs) by supplying enable signals to these sets along enable lines 350, 355, 360, and 365.

Figure 4:
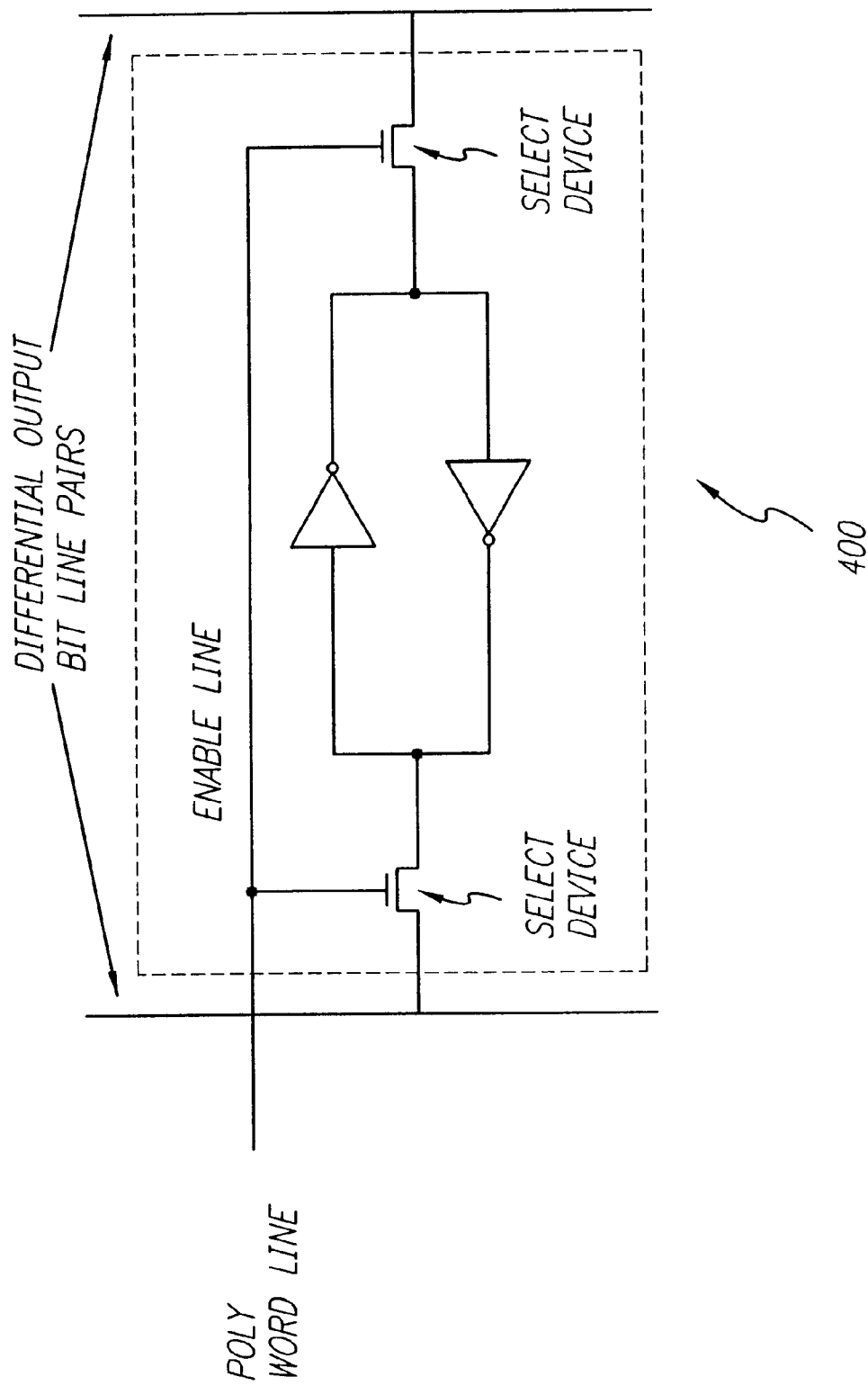
FIG. 4 presents one embodiment of a register that is used in a register array of FIGS. 3A and 3B.

As shown in FIG. 4, which sets forth one embodiment of a register that is used in register array 315 of FIG. 3A, a register 400 outputs it content on the differential output bit lines that are coupled to it, when this register receives an enable signal along the enable line that couples it to said selector 305.

Output detection circuitry 325 then detects the differential signal that appears between the two complementary differential output bit lines, in order to determine the contents of the registers in the enabled sets of registers. For the purpose of explanation, FIGS. 3A and 3B present a detailed embodiment of output detection circuitry 325. As shown in this figure, output detection circuit 325 includes an output decoder 370, AND gates 375, and amplifiers 380.

One embodiment of the output decoder 370 is a column decoder which sequentially supplies the differential signals on each differential output bit line pair to sense amplifiers 380 during a read operation, in order to sequentially generate the contents of the registers in the enabled set of registers. Alternatively, another embodiment of output decoder 370 supplies registers. Alternatively, another embodiment of output decoder 370 supplies all of the differential bit line pairs of the enabled sets of registers to a number of sense amplifiers, in order to generate the content of the enabled sets of registers in parallel. Furthermore, during a write operation, a write enable signal is provided to AND gates 375, in order to cause the signals that appear on write lines 385 to be transmitted to a particular register along its corresponding differential bit lines and to be stored in this particular register.

In the unaligned access of a four-word set, it has been shown that the two methods based on FIG. 3A are available, but both are un-optimized in terms of the physical integrated circuit area used for the implementation.

Figure 5:
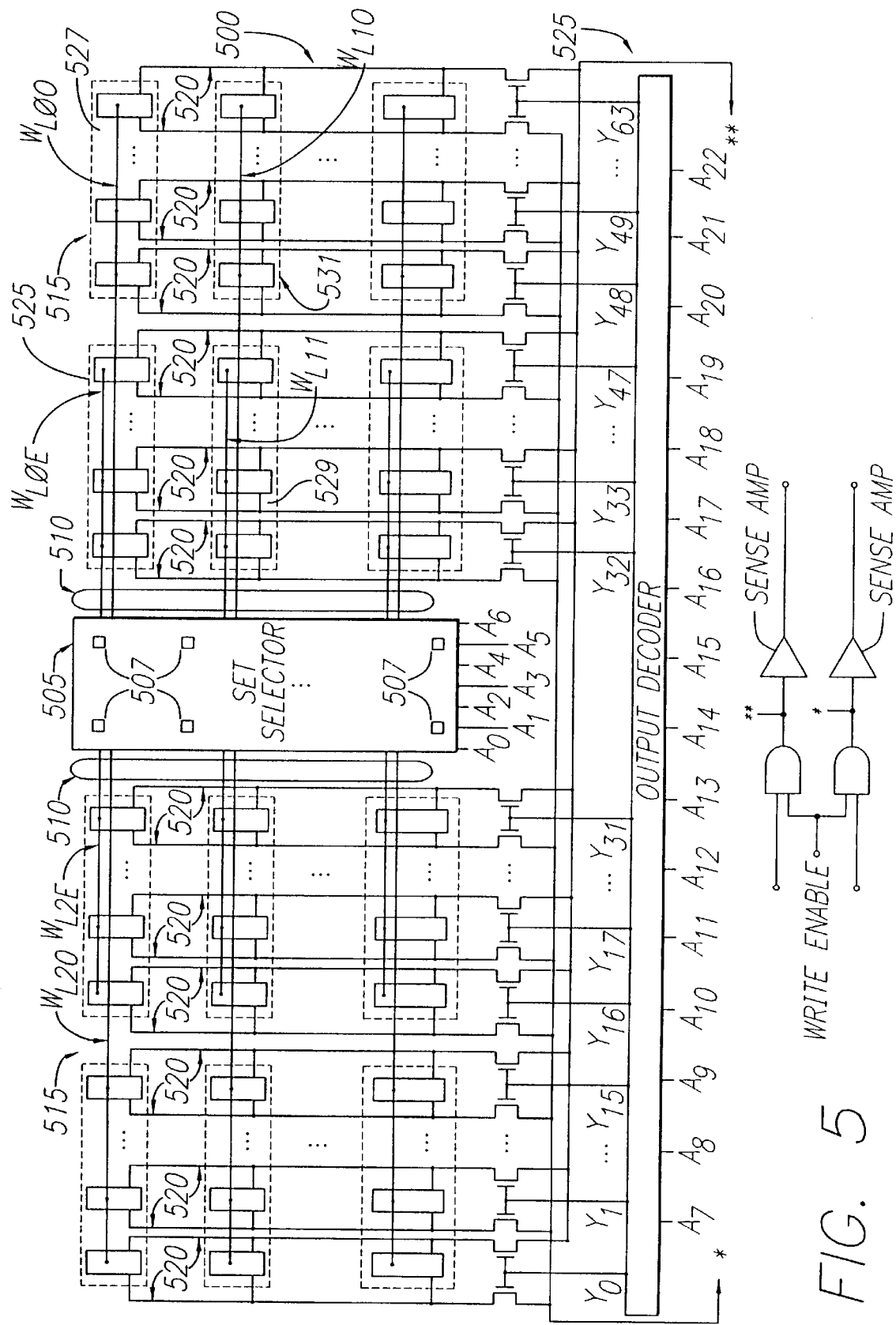
FIG. 5 presents an embodiment of the present invention's memory apparatus for selectively enabling individual sets of registers in a row of a register array.
Figure 6:
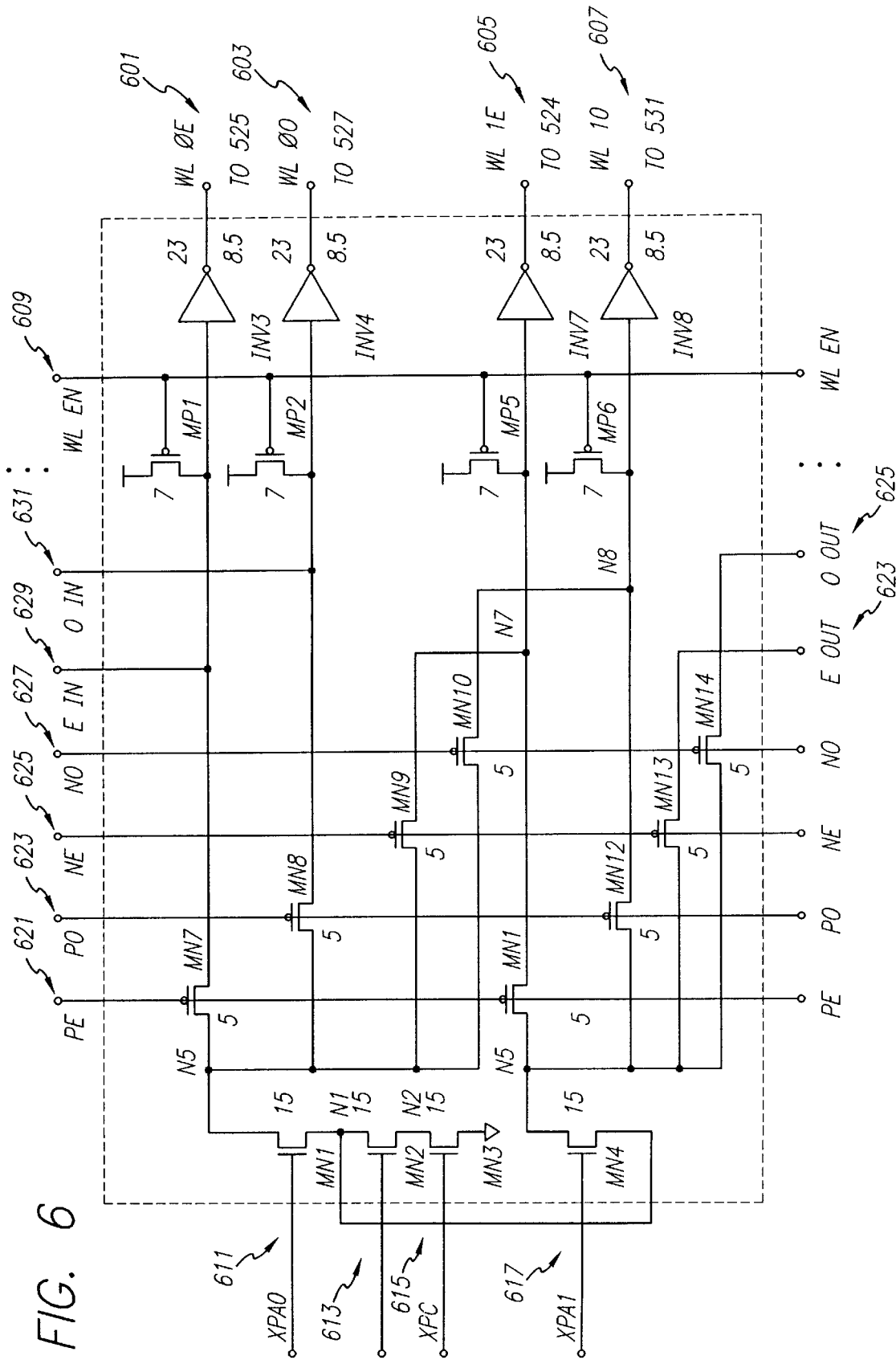
FIG. 6 illustrates the selector circuit of FIG. 5.

An improvement, in terms of area optimization is depicted in FIGS. 5 and 6.

FIG. 5 presents an embodiment of the present invention's apparatus for selectively enabling individual sets of registers in a row of register array. Like memory 300, memory 500 includes set selector 505, set selecting enable lines 510, register array 515, output bit lines 520, and output detection circuitry 525. As these components of memory 500 are identical to the components of memory 300, their operation will not be described in order not to obscure the present invention with unnecessary detail.

As shown in FIG. 5, unlike set selector 305 of memory 300 which is positioned adjacent to one side of register array 315, set selector 505 is positioned at the center of the register array. This placement of set selector 505 in turn reduces the number of set selecting enable lines that traverse across each register by half. This reduction in the number of enable lines that traverse each register in turn reduces the minimum size of the registers, and thereby reduces the cost of memory 500 by reducing the required amount of silicon.

The present invention provides a single set selector 505 in conjunction with memory cells that pass two physical metal word lines over the cell itself. The set selector 505 includes a plurality X-decoders 507. For each two rows, two X-decoders 507 are required. The X-decoders 507 will be described in greater detail with reference to FIG. 6. The actual word line of the memory cell is in poly-silicon interconnect used to form the gates of the memory cell select devices as shown in FIG. 4. The word line that controls the select of a given memory cell is determined by contacting the poly-silicon word line with the appropriate metal word line (WL0, WL1, WL2, or WL3) as shown in FIG. 5.

The present invention provides a selector 505 that enables two word line choices per row. Moreover, the present invention provides a selector 505 that can select a set of four word lines and that can select the "next" row (i.e., all the functions of the circuit of FIG. 3A), while optimizing and conserving the amount of layout area.

FIG. 6 illustrates the details of the selector 505. The selector 505 includes two X-decoders 507 per every two rows with one X-decoder driving word lines to the right of the selector 505 and the other X-decoder driving word lines to the left of the selector 505, as illustrated in FIG. 5.

FIG. 6 illustrates an X-decoder for the memory banks on the right.

There is an identical X-decoder for two word lines of the memory banks on the left, not shown in FIG. 6.

The X-decoder 507 of FIG. 6 controls two rows of memory banks (WL0 and WL1). The "E" and "O" suffix for each of the rows simply designates an "even" or an "odd" designation. Referring again to FIG. 5, asserting the WL0E 601 enables the first set of memory cells 525 in row 1. Similarly, if WL0O is asserted, the second set of memory cells 527 is enabled. Similarly, if WL1E is asserted, the first set of memory cells 529 is enabled, and if WL1O is asserted, the second set of memory cells 531 is enabled.

The WLEN 609 signal is simply a precharge signal that places the outputs in a predetermined steady state (i.e., a logic low). The address lines, provided to the set selector 505, are used to generate XPA0 611, XPB 613, XPC 615 and XPA1 617. The signals XPA0 611 and XPA1 617 determine which row is enabled. The signals, XPB 613 and XPC 615, determine which set of the two sets in a row is enabled. The use of the address signals to generate XPA0 611, XPB 613, XPC 615 and XPA1 617 are well known in the art. Similarly, the precharge signal WLEN and its function and operation are well known in the prior art.

Control lines, Present Even (PE) 621, Present Odd (PO) 623, Next Even (NE) 625, and Next Odd (NO) 627 select whether the present addressed word line (i.e., row) is to be selected or the next word line (i.e., row), so as to enable selection of complete four-word sets with an unaligned address. $E_{IN}$ 629 and $O_{IN}$ 631 are inputs from the previous X-decoder above, and $E_{OUT}$ 623 and $O_{OUT}$ 625 feed to the $E_{IN}$ 629 and $O_{IN}$ 631 of the next X-decoder below to provide continuity in selecting the next word line for unaligned accesses. For example, the $E_{IN}$ 629 and $O_{IN}$ 631 of the X-decoder below the present decoder, illustrated in FIG. 6, receives the $E_{OUT}$ 623 and $O_{OUT}$ 625 provided by the X-decoder of FIG. 6.

The Present Even (PE) 621 signal enables WL0E 601, the Present Odd (PO) 623 enables WL0O 603. While Next Even 625 enables WL1E 605, and Next Odd 627 enables WL1O 607. The signals PE 621, PO 623, NE 625, NO 627 are provided by the set selector 505. Please note that set selector 505 always selects only one of these signals, as these signals are mutually exclusive of each other.

In the preferred embodiment, the two physical metal word lines required no additional space to run over the memory cells. In other words in this case, this functionality came "free" with no area penalty.

The selector block is slightly larger than that of a selector block without the unaligned word line select feature. Hence, this the present invention offers the unaligned access of full four word sets from the memory with very little area penalty, as compared to the prior art approaches.

Consequently, as apparent from the description above, the method and apparatus of the present invention is advantageous as it provides an optimal superscalar data dispatch method and apparatus that allows an N-word wide memory array to simultaneously enable N non-overlapping sets of registers that store N data words. More specifically, the present invention is advantageous as it provides a method and apparatus for reducing a superscalar processor's instruction retrieval time (i.e., the time needed to obtain N requested instruction words from an instruction memory) and thereby taking advantage of the parallel pipeline processing capability of superscalar processors. In other words, the present invention improves the instruction processing efficiency of superscalar processors by providing an N-wide register array that can enable N non-overlapping sets of registers in one clock cycle when it receives a signal that identifies the N non-overlapping sets of registers.

One of ordinary skill in the art would recognize that the above-described invention may be embodied in other specific forms without departing from the spirit or the essential characteristics of the disclosure. For instance, although for purposes of explanation four set wide register arrays have been illustrated in the figures, one of ordinary skill in the art would understand that in alternative embodiments of the present invention the width of the register array is different than four sets. Thus, while certain exemplary embodiments have been described and shown in the accompanying drawings, the invention is not to be limited by the foregoing illustrative details but rather is to be defined by the appended claims.

What is claimed is:

1. A memory comprising:
   (a) a register array of an N word wide set of data word resisters arranged for parallel accessing of a read or write operation, said array having a plurality of registers arranged in a plurality of rows and columns, wherein each row includes N sets of data word registers, said accessing being performed simultaneously on said N sets of data word registers originating from a starting address specified by an address pointer register and delivering a remaining N−1 sets of data words from contiguous addresses, and further wherein said accessing delivers a contiguous N sets of data words even when said starting address is unaligned with the physical starting address of the selected row, causing said data words to be accessed from a next physical row to complete a simultaneous delivery of said N set of data words;
   (b) N set selecting enable lines for each row of registers, each of said set selecting enable lines coupled to one set of registers in said N sets of data word registers in a row; and
   (c) a set selector coupled to the N set selecting lines for selectively enabling a particular set of registers by supplying an enable signal on the enable line that couples said set selector to said particular set of registers, said set selector positioned in middle of said rows of registers such that, in each row, N/2 sets of registers are to a first side of said set selector and N/2 sets of registers are to a second side of said set selector and said set selector emulating N set selecting lines per row by employing N/2 lines per side of said set selector.

2. The memory of claim 1 wherein said set selector further includes a plurality of decoders, each said decoder associated with two rows, each said decoder having a plurality of inputs, said plurality of inputs receiving a plurality of control signals, said control signals including a signal from a preceding decoder, each said decoder in response to said control signals, enabling one of a register in a present row and a register in a next row and providing at least one control signal to a subsequent decoder.

3. The memory of claim 2, wherein said control signals include a present even signal for enabling an even register in the present row, a present odd signal for enabling an odd register in the present row, a next even signal for enabling an even register in the next row and a next odd signal for enabling an odd register in the next row.

4. A computer system comprising:
   (a) a processor operating a parallel mode of execution;
   (b) a bus coupled to said processor;
   (c) a memory coupled to said processor through said bus, said memory comprising:
      (1) a register array of an N word wide set of data word registers arranged for parallel accessing of a read or write operation, said array having a plurality of registers arranged in a plurality of rows and columns, wherein each row includes N sets of data word registers, said accessing being performed simultaneously on said N sets of data word registers originating from a starting address specified by an address pointer register and delivering a remaining N−1 sets of data words from contiguous addresses, and further wherein said accessing delivers a contiguous N sets of data words even when said starting address is unaligned with the physical starting address of the selected row, causing said data words to be accessed from a next physical row to complete a simultaneous delivery of said N set of data words;
      (2) a set selector;
      (3) N set selecting enable lines for each row of registers, each of said set selecting enable lines coupling said set selector to one set of registers in said N sets of data word registers in a row; and
      (4) wherein said set selector selectively enables a particular set of registers by supplying an enable signal on the enable line that couples said set selector to said particular set of registers and said set selector is positioned in middle of said rows or registers such that, in each row, N/2 sets of registers are to a first side of said set selector and N/2 sets of registers are to a second side of said set selector and said set selector emulating N set selecting lines per row by employing N/2 lines per side of said set selector.

5. The computer system of claim 4 wherein the set selector further includes a plurality of decoders, each decoder associated with two rows, said decoder having a plurality of inputs, said plurality of inputs for receiving a plurality of control signals, said control signals including a signal from a preceding decoder, said decoder in response to said control signals, enabling one of a register in a present row and a register in a next row and providing at least one control signal to a subsequent decoder.

6. The computer system of claim 5, wherein said control signals include a present even signal for enabling an even register in the present row, a present odd signal for enabling an odd register in the present row, a next even signal for enabling an even register in the next row and a next odd signal for enabling an odd register in the next row.

7. A method for enabling registers in a register array comprising the steps of:
   (a) receiving an input signal identifying a first set of registers in a first row of said register arrays, said register array having an N word wide set of data word registers arranged for parallel accessing of a read or a write operation, said register array having a plurality of registers arranged in a plurality of rows and columns, wherein each row includes N sets of data word registers;
   (b) selectively enabling said first set of registers in said first row of said register array by supplying an enable signal on a first enable line to enable said first set of registers; and
   (c) emulating N set selecting lines by employing N/2 physical lines.

8. The method of claim 7 wherein said input signal also identifies a second set of registers in said first row of said register array, said method further comprising the steps of selectively enabling said second set of registers by supplying an enable signal on a second enable line to enable said second set of registers.

9. The method of claim 7 wherein said input signal also identifies a second set of registers in a second row of said register array, said second set of registers not overlapping said first set of registers, said method further comprising the steps of selectively enabling said second set of registers by supplying an enable signal on a second enable line to enable said second set of registers.

10. The memory of claim 3, wherein each of the control signals is coupled to an associated pass transistor, each pass transistor selectively enabling one of an even register in the present row, an odd register in the present row, an even register in the next row, and an odd register in the next row.

11. The memory of claim 10, wherein each of the control signals includes a present even signal for enabling an even register in the present row, a present odd signal for enabling an odd register in the present row, a next even signal for enabling an even register in the next row and a next odd signal for enabling an odd register in the next row.

* * * * *